United States Patent [19]
Scheitz et al.

[11] Patent Number: 5,762,511
[45] Date of Patent: Jun. 9, 1998

[54] ZERO INSERTION FORCE PIN GRID ARRAY SOCKET

[75] Inventors: John T. Scheitz, Barrington; Michael V. Stefaniu, Lake Zurich; Kathleen A. Capilupo, Palatine; Charles A. Kozel, McHenry, all of Ill.

[73] Assignee: Methode Eletronics, Inc., Chicago, Ill.

[21] Appl. No.: 749,069

[22] Filed: Nov. 14, 1996

Related U.S. Application Data

[63] Continuation of Ser. No. 321,329, Oct. 11, 1994, abandoned.

[51] Int. Cl.$^6$ ........................................... H01R 4/52
[52] U.S. Cl. ........................................ 439/342; 439/259
[58] Field of Search ............................... 439/259, 268, 439/347, 341, 342, 343, 330, 331

[56] References Cited

U.S. PATENT DOCUMENTS

| | | | |
|---|---|---|---|
| 4,412,713 | 11/1983 | Nishikawa | 439/342 |
| 4,538,870 | 9/1985 | Thewlis | 439/259 |
| 4,988,310 | 1/1991 | Bright et al. | 439/342 |
| 4,997,385 | 3/1991 | Casagrande | 439/342 |
| 5,057,031 | 10/1991 | Sinclair | 439/342 |
| 5,342,214 | 8/1994 | Hsu | 439/342 |
| 5,387,121 | 2/1995 | Kurz | 439/342 |

FOREIGN PATENT DOCUMENTS

| | | | |
|---|---|---|---|
| 1000554 | 8/1965 | United Kingdom | 439/342 |

OTHER PUBLICATIONS

3M, Electronic Interconnection Systems: Product Selection Guide, with reference in particular to the Textool Test and Interconnect Systems at p. 15.

*Primary Examiner*—Hien Vu
*Attorney, Agent, or Firm*—David L. Newman

[57] ABSTRACT

A zero insertion force pin grid array socket includes a cover slidably engaged to a base and having an array of holes formed therethrough. The base has an array of corresponding passages, the passages receiving pins of an IC package inserted through corresponding holes of the cover. Contacts are mounted within the passages and include a generally tuning-fork shaped contact having torsional beams which deflect the insertion forces of the pin of the IC package which have a surface area of at least forty percent of the entire surface area of contacts. The contacts include wiping areas which are plated which have a surface area of less than an eightieth of the entire surface area of the contact. The socket cover includes a means for providing an air-gap between the socket cover and the IC package.

5 Claims, 2 Drawing Sheets

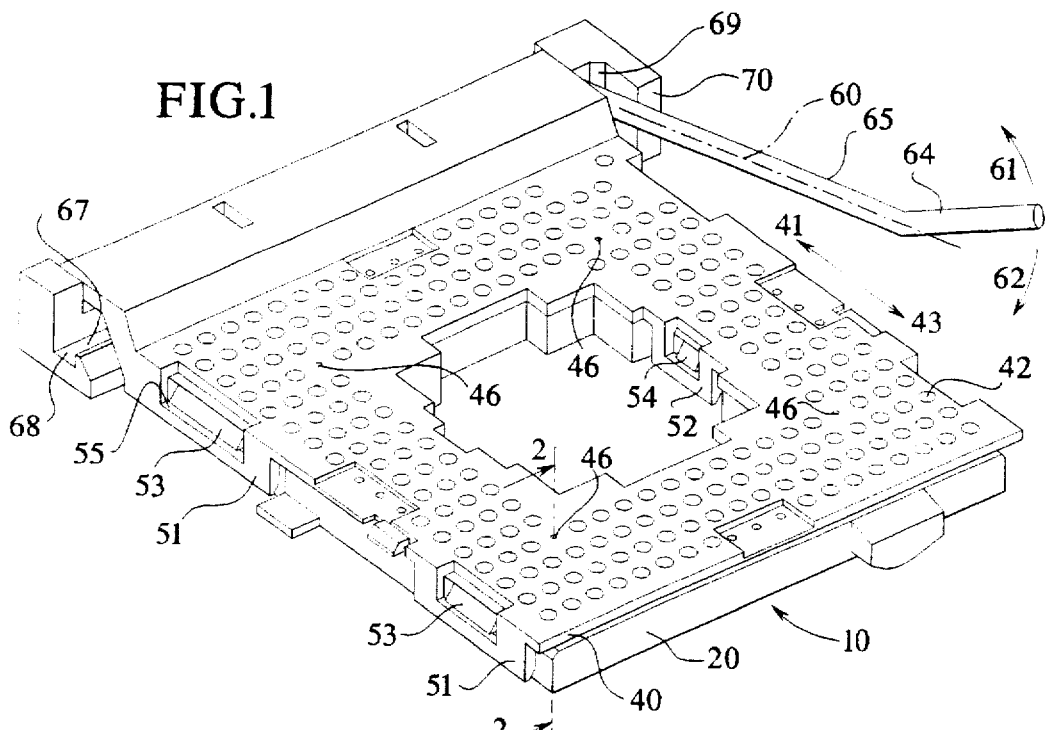
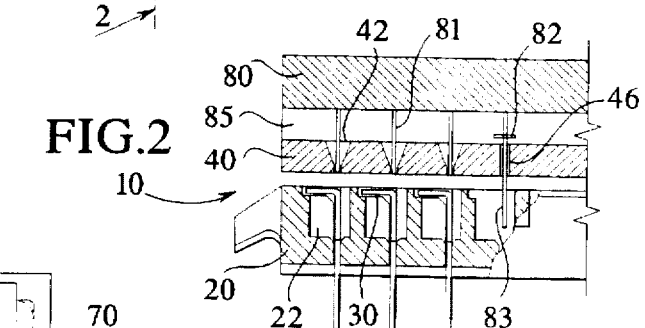
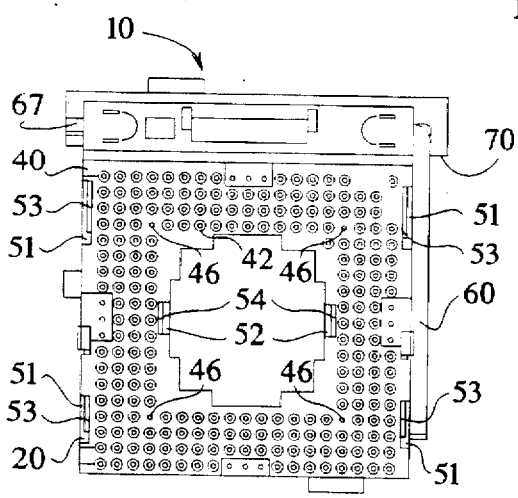
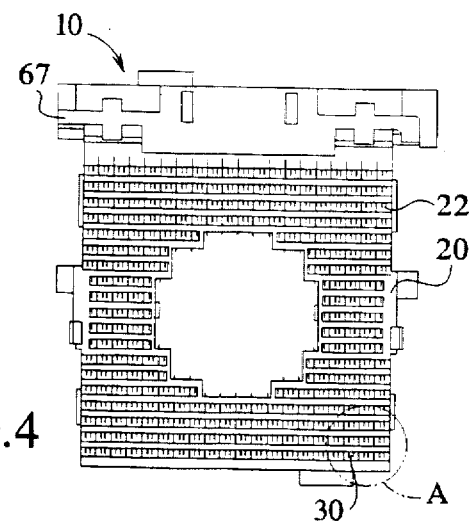

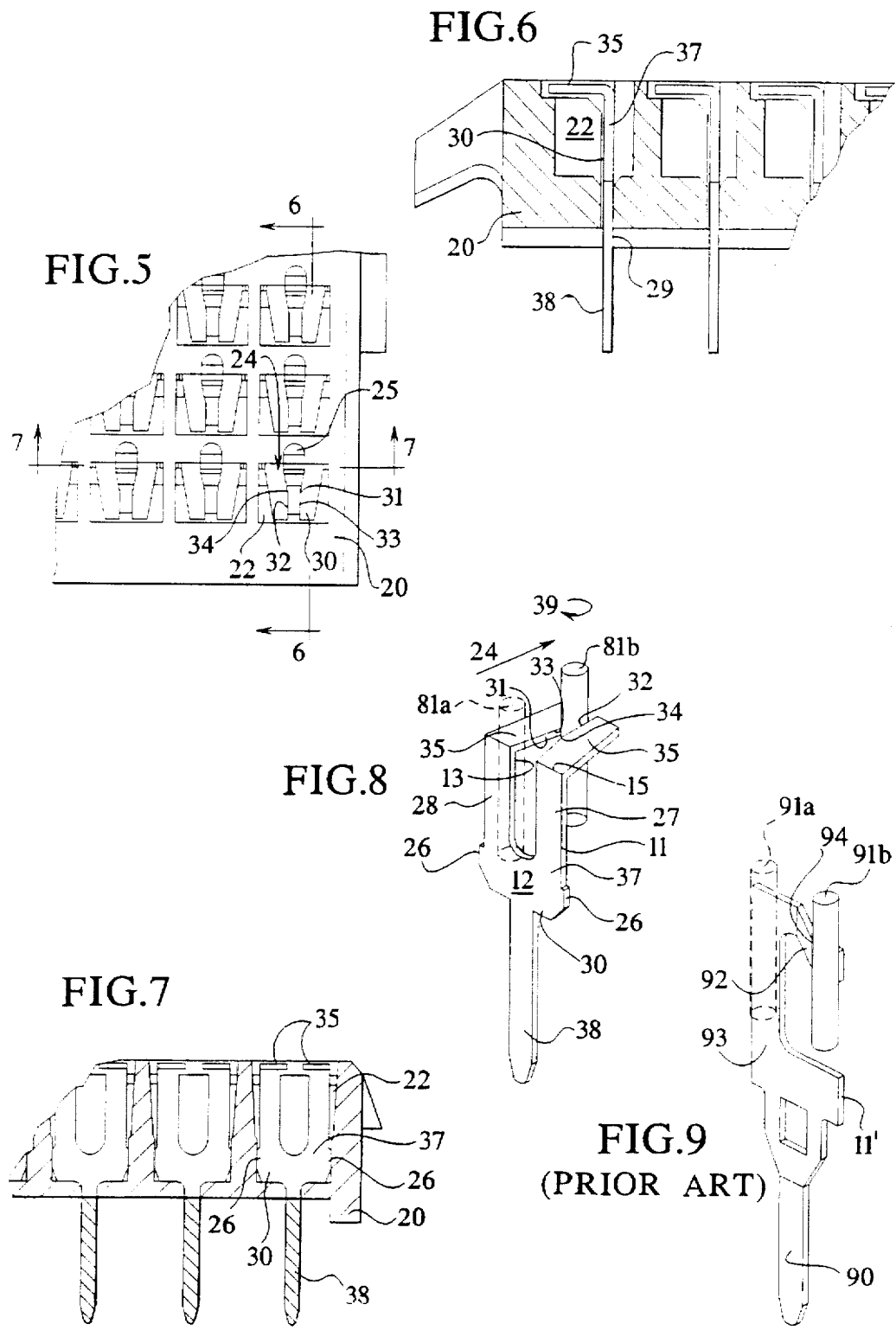

5,762,511

ZERO INSERTION FORCE PIN GRID ARRAY SOCKET

This is a continuation of application Ser. No. 08/321,329, filed Oct. 11, 1994 now abandoned.

This application is related to U.S. Pat. No. 5,489,217, filed this same date, Oct. 11, 1994.

BACKGROUND OF THE INVENTION

The present invention relates to an electrical connector and, in particular, a zero insertion force, pin grid array socket.

Integrated circuits (ICs) have become the world's standard for electronic circuits. These range from basic transistor networks to complex memory, microprocessor and multi-chip module circuits. The common denominator to all such circuits is that they are produced en masse on a substrate such as silicon and then separated into individual units commonly known as chips. The majority of chips are then mounted in a carrier for subsequent incorporation into end products. The basic size, shape and construction of the carrier is commonly known as the package and many standard packages have emerged. Some examples are commonly known as DIP, SOJ, PLCC, QFP and PGA. Chip packages have developed to accommodate both circuit function, i.e., number and placement of leads, and assembly trends, i.e., through-board and surface mount solder assembly. While the majority of IC devices are hard soldered in place, several factors such as device availability, testing, upgrades, etc., have traditionally shown that there is a need to socket ICs regardless of their package. IC sockets are known in the art for receiving pin grid array (PGA) packages. Previous PGA sockets required a high insertion force or low insertion force. Such sockets resulted in lead damage due to the high insertion and withdrawal forces. Presently, IC packages have increasingly larger pin counts due to the continued miniaturization of the ICs. Such increased pin counts require zero insertion force (ZIF) sockets. For example, Intel, Inc. OverDrive™ Processor Sockets are known in the art. Generally, the contacts used in these sockets are referred to as normally closed contacts. Such ZIF PGA sockets are known in the art but include complex and expensive contact designs. Such contact designs are stressed greatly as the insertion forces increase. Also, such common contact designs have large plating areas which increase cost. Further, such socket designs do not provide for adequate cooling of the IC packages. Accordingly, there is desired a ZIF PGA socket design which overcomes the aforementioned shortcomings.

SUMMARY OF THE INVENTION

It is, therefore, an object of the present invention to provide a socket which includes a contact design which is quickly and inexpensively manufactured.

It is another object of the present invention to provide a socket having a contact design which provides for a selective plating area.

It is a further object of the present invention to provide a socket having a contact design which provides for low stress-strain upon increase of normal force.

It is another object of the present invention to provide a contact design providing for great elastic range upon insertion.

It is a further object of the present invention to provide a contact which may be generated on a die having small centers to reduce material usage.

It is another object of the present invention to provide an air-gap to provide additional cooling of the IC package.

Accordingly to the above object of the present invention, a zero insertion force, pin grid array IC socket comprises a cover slidably engaged to a base and the cover having an array of holes formed therethrough corresponding to an array of passages in said base for receiving a corresponding array of IC pins. The passages of the base including contacts having a generally tuning-fork shape, having a tail portion and a U-shaped portion having a pair of torsional beams. The U-shaped portion has an open side including retention arms being bent at a 45°–90° angle to the plane of the tail and U-shaped portion. The open portion of the contact includes a pair of wipe surfaces and shoulders. The wipe surfaces being at the stamped edge of the contact.

The contact includes a pair of continuous torsional beams having a surface area of at least forty percent of the surface area of the entire contact. The torsional beam provides for a low stress/strain force ratio.

The contact includes a pair of wipe surfaces along the stamped edge or first side of the open end of the contact. This arrangement provides for a reduced selective plating area. A selective plating area includes an area less than an eightieth of the size of the entire contact.

Further, an air-gap means is provided including a stand-off hole through the cover for receiving an IC package pin having a stand-off thereon wherein insertion of the stand-off pin in the stand-off hole causes the stand-off to abut the top surface of the cover.

These and other features of the invention are set forth below in the following detailed description of the presently preferred embodiments.

BRIEF DESCRIPTION OF THE DRAWINGS

FIG. 1 is a perspective view of the socket of the present invention;

FIG. 2 is a partial side elevation cut-away view of FIG. 1 taken at line 2—2;

FIG. 3 is a plan view of the socket of FIG. 1;

FIG. 4 is a plan view of the socket of the present invention having the cover removed;

FIG. 5 is an enlarged plan view of Area A of the socket of FIG. 4;

FIG. 6 is a side elevation cut-away view of the socket of FIG. 5, taken at line 6—6;

FIG. 7 is a side elevation cut-away view of the socket of FIG. 5, taken at line 7—7;

FIG. 8 is a perspective view of a contact of the present invention; and

FIG. 9 is a perspective view of a contact of the prior art.

DETAILED DESCRIPTION OF THE PRESENTLY PREFERRED EMBODIMENTS

An embodiment of the zero insertion force, pin grid array socket of the present invention is best understood by FIGS. 1–8. Turning to FIG. 1, socket 10 is shown in perspective view, having base 20 and cover 40. The cover includes an array of holes 42 for receiving pins of an IC package. The holes 42 generally are beveled in order to assist in the insertion of the pins of the IC package. The socket 10 includes actuator 60 for sliding the cover 40. FIG. 1 shows the actuator 60 in an intermediate position. By moving the actuator 60 in direction of arrow 61, the cover 40 will be slid in direction of arrow 41 to move the cover 40 into the opened position. In this position, the IC package will be mounted to the socket 10 via insertion of the IC package pins through the corresponding array of holes 42 of the cover 40. The array of pins of the IC package are inserted through the array of holes 42 of the cover 40 and into the corresponding array of passages of the base 20. Due to the design of the contacts and the passages of the base 20, the insertion of the pins requires a zero insertion force. Following full insertion of the pins into the holes 42 and passages of the base 20, the actuator 60 is moved in direction of arrow 62 causing the cover 40 to slide in direction of arrow 43, forcing the pins into their fully mated position with the contacts mounted in the passage of the base 20.

The cover 40 is mounted to the base 20 via outer latches 51 which engage hooks 53 of the base 20. As well, the cover 40 includes inner latches 52 which engage inner hooks 54. In a preferred embodiment, the latches 51,52 are integrally molded with the cover 42 and the hooks 53,54 are integrally molded with the base 20. The latches include an opening 55. The opening 55 has a sufficient width greater than the hooks 53,54, so that the cover 40 may slide freely in direction of arrows 41,43 without abutting the hooks 53,54. While the latches 51,52 act to retain the cover 40 onto the base 20, they also provide a means for limiting warpage of the cover 40. The IC packages which are mounted to the socket 10 can undergo great changes in heat dissipation. Such heat may cause the warpage of the socket 10. To avoid such warpage in a preferred embodiment, four outer latches 51 are oriented in each corner of the socket 10 and a pair of inner latches 52 are oriented on either side of the inner portion of the socket 10.

The socket 10 includes on its cover, stand-off hole 46. The stand-off hole 46 receives a stand-off mounted on selected pins of the IC package. According to specific industry specifications, each IC package includes four stand-off pins adjacent the center of the package. The stand-offs are received by the stand-off holes 46 of the present invention and maintain an air-gap between the cover 40 of the socket 10 and the IC package (see FIG. 2). The actuator 60 of the present invention, in its preferred embodiment, includes an end portion 64 which is bent at an angle of approximately 15°–30° from the axis of the shaft 65 of the actuator 60. The bent end portion 64 of the actuator 60 allows for the actuator to be easily grasped to move the actuator from its closed position to the open position. Especially when an IC package is mounted to the socket 10, the bent end portion 64 of the actuator 60 is easily grasped. The actuator 60 is mounted in channel 67 of the base 20. The channel 67 has an open end 68 and a closed end 69. At the closed end 69, a retaining wall 70 extends from the edge of the base 20 and is perpendicular to channel 67. A retaining wall 70 retains the actuator 60 within channels 67 upon attachment of cover 40 over the actuator 60 and onto the base 20.

FIG. 2 shows a partial side elevation cut-away view of FIG. 1, taken at line 2—2 and also shows an IC package 80 mounted to the socket 10. Base 20 includes passages 22. Mounted within most passages 22 are contacts 30. Mounted to base 20 is cover 40. The cover includes holes 42. Generally, these holes are beveled to allow the easy insertion of pins 81 of the IC package 80. However, in a preferred embodiment at four positions on the cover 40, stand-off holes 46 are not beveled and are only a through-hole having a diameter slightly larger than the pins 81 of the IC package 80. As the stand-off 82 has a diameter which is larger than the diameter of the stand-off hole 46, the stand-off 82 prohibits the pin from being inserted any further into the socket 10. As the stand-off 82 of the pin 83 is spaced between 0.200 inches to 0.180 inches from the base of the IC package 80, there is provided an air-gap 85 of equal spacing. This air-gap provides for the circulation of air between the IC package 80 and the socket 10. The air-gap allows for heat reduction to occur for the IC package 80 and the socket 10.

FIG. 3 is a plan view of the socket 10 of FIG. 1 having cover 40 and base 20. The cover 40 includes holes 42 which include a beveled opening for receiving the pins of a IC package. Stand-off holes 46 are through-holes which do not have a beveled opening. Actuator lever 60 is mounted in channel 67 of housing 20 and is retained to the socket 10 via retention wall 70. The actuator 60 may be mounted on either the right or left side of the socket 10. Outer latches 51 engage hooks 53. Inner latches 52 engage hooks 54.

FIG. 4 is a plan view of the socket 10 having the cover removed. The base 20 is shown having an array of passages 22. Contacts 30 are mounted in passages 22. Channel 67 is shown having the actuator removed. In a preferred embodiment, the socket 10 houses two hundred and thirty-six contacts on 0.100 inch spacing. Generally, the socket 10 has an overall dimension of 1.940 inch×2.430 inch×0.320 inch. In a preferred embodiment, the housing of the cover and base are injection molded from a polymeric material.

Turning to FIG. 5, an enlarged plan view of Section A of FIG. 4 is shown. Base 20 includes passages 22 having contact 30 mounted therein. Upon initial insertion of the pins of an IC package, the pins are inserted through the cover and are received in zero insertion force bore 25. The zero insertion force bore 25 has a diameter greater than the diameter of the pin of the IC package. The pin is then slid in direction of arrow 24 and is moved from zero insertion force bore 25 into passage 22 via the movement of the cover. The pin first contacts shoulders 31,34 of the retention arms 35 of contact 30. The pin then continues past shoulders 31 to arrive in its fully mated position against wipe areas 32,33.

FIG. 6 is a side elevation cut-away view, taken at line 6—6 of FIG. 5. The base 20 includes passages 22 having contacts 30 mounted therein. The contact includes tail 38 and U-shaped section 37 at the opposite end from the tail 38. U-shaped section 37 has at its open end retention arms 35. The retention arms 35 are bent at approximately a right angle to the plane of the tail 38 and U-shaped section 37 and transverse to the stamped edge or first side 11 (see FIG. 8) of the contact 30. The tails 38 of the contacts 30 are inserted into apertures 29 of the base 20.

FIG. 7 is a side elevation cut-away view of FIG. 5 taken at line 7—7. Base 20 is shown having passages 22 having contacts 30 mounted therein. The contacts 30 have tail portion 38 and at the end opposite end, U-shaped section 37. The U-shaped section 37 has at its open end retention arms 35. The contacts 30 also include wings 26 for providing a friction fit of the contact 30 within passage 22.

Turning to FIG. 8, contact 30 includes tail 38 at one end and U-shaped section 37 at the other end. U-shaped section 37 includes an open end having torsional beams 27,28. At the end of the torsional beams 27,28 are retention arms 35. The retention arms 35 are bent at an angle to the U-shaped section 37 and tail portion 38 of the contact 30. The angle at which the retention arms 35 are positioned may vary from between 45°–90°. The retention arms 35 of the contact 30 include shoulders 31,34 and wiping areas 32,33.

The insertion of the pin of the IC package into the contact 30 is represented by pins 81a,81b. Generally, contact 30 is a stamped contact of a copper ally or phosphor bronze. The contact is stamped on a die in a unitary plane. The unitary plane is that of the tail 38 and U-shaped section 37. The stock that the contact 30 is stamped from, in a preferred embodiment, has a stamped edge or a first side 11 which generally has a thickness of 0.005 inch and a wipe area 33 which is approximately 0.030 inches long, providing a total wiping surface area of 0.00036 square inches compared to the total contact surface area which is 0.031 square inches or approximately eighty-six times the wiping surface area. This small wiping area allows for selective plating of a small area of the contact 30. Prior to the forming of the retention arms 35 at approximately a right angle, the contact in its unitary plane is plated at this selective wiping area 33 or target area. A method of forming the socket includes preparing a plurality of contacts on a die in a unitary plane plated generally at the selective wiping area 33. It can be seen that the overall design of this contact allows for a great reduction in the plating materials required for this contact 30. In a preferred embodiment, gold plating is adhered to wipe areas 32,33 and due to the small area, the plating costs are greatly reduced. Such plating techniques may include mask plating or controlled depth plating. Such plating techniques may be applied either before or after bending of the retention arms 35. As well, the contact design of the present invention allows for the contacts to be spaced on the die on 0.100 inch spacing so that they may be quickly and easily inserted into the passages 22 of the base 20 and providing for minimal material usage.

The IC package pin 81a is initially inserted into the zero insertion force bore and is then slid in direction of arrow 24. The pin 81a is slid between the retention arms 35 of the contact 30. The pin 81a initially contacts shoulders 31,34 of the retention arms 35. As the pin 81a slides past shoulders 31,34, the greatest amount of force is received by the contact 30. Because each retention arm 35 is a unitary member with the entire torsional beams 27,28 and U-shaped portion 37, the entire force received at shoulder 31 is spread along the entire length of the torsional beams 27,28 of the U-shaped section 37. The force of the pin 81b against shoulders 31 causes the torsional beams 27,28 including the retention arms 35 to deflect in a torsional manner in direction of arrow 39. Each torsional beam 27,28 of the contact 30 receives this torsional deflection upon insertion of the pin 81b.

The present contact design provides for the contact being stamped from a sheet of material having a narrow Z dimension or thickness or first side 11. The rolled surface of the material is of sufficient width and length for the X-Y dimensions of the contact and define a second side 12 and a third side 13. The retention arms 35 are bent at an angle to the second side 12 or third side 13 of the contact 30. Such bending along the relatively lengthy crease 15, as compared to the thickness of first side 11, provides for a large surface area of the contact 30 for the torsional motion 39 induced by the normal force of pins 81a,81b to be transferred beyond the retention arms 35 and to the entire torsional beam 27,28. Such torsional beams 27,28 provide for the advantages of the present invention of a low stress/strain force ratio and a great elastic range, as compared to the straight cantilever designs of the prior art (see FIG. 9). The prior art contact designs have the retention arm 92 bent (or stamped) at an angle to the first side 11' which provides only the narrow thickness of the contact to receive the torsional forces of the retention arm; which are not transferred to the beam 93 of the contact 90. Due to the dispersion of the normal force of the pin 81a of the present invention along the entire torsional beams 27,28 length, the stress-strain measurement is lessened for this contact design. Thus, the torsional beams having a surface area of at least forty percent of the entire contact surface area, provide for greater elastic range than the contacts of the prior art, while maintaining sufficient normal forces.

After the pin 81a is slid passed shoulders 31 of each retention arm 35, it attains its final mating position against wiping areas 32,33. Pin 81b is shown in the final mated position abutting wiping areas 32,33 of the retention arms 35 of the contact 30. The distance between wipe areas 32,33 is only slightly greater than that between shoulders 31,34, and the force of the contact 30 against the pin 81b is a sufficient normal force to hold the pin 81b therein.

FIG. 9 shows a prior art contact 90 of a generally straight cantilever design. The contact 90 includes only a single wipe area 94 and includes a retention arm 92 which is formed at an angle to the first side 11' or thickness of the contact 90. Pin 91a is moved to its mated position 91b next to wiping area 94. Upon such movement, the entire force is taken up by only the retention arm 92. The majority of the body of the contact 90 including beam 93 is not acted on by the normal force of the pins 91a,b. As well, the prior art contact design requires a large area to be plated. Due to the shape of the contact 90, it is generally necessary to plate the entire retention arm 92 and sometimes the whole upper portion of the contact 90. Such prior art contacts do not have the advantage of the contact of the present invention in that two wipe areas are not provided, insertion forces are not deflected throughout the majority of the contact surfaces and selective plating of small areas cannot be undertaken.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A zero insertion force, pin grid array socket comprising:
   a cover slidably engaged to a base and having an array of holes formed therethrough;
   said base having an array of zero insertion bores connecting to passages, said holes corresponding to said zero insertion bores for receiving pins of an IC package;
   contacts mounted in said passages including a generally tuning-fork shape having a tail at a first end and pair of torsional beams at the opposite end and the tail and torsional beams being planar, each said torsional beam having a flat rectangular shape and each said torsional beam attached to the tail and in a same with the tails, and at the opposed end having a pair of retention arms bent along a crease at an angle to the plane of the torsional beam, said retention arms having shoulders and wiping areas and the retention arms having a pin entry point at the crease and adjacent the plane of the torsional beam and the tail and a gap between the retention arms at the pin entry point is greater than the diameter of the pin and the retention arms having a terminal point opposed to the pin entry point and the gap between the retention arms at the terminal point is less than the diameter of the pin wherein the torsional beam takes up normal forces applied to the contacts through said terminal point of the retention arms, the forces applied by said pins, wherein the zero insertion bores are positioned adjacent to one side of said torsional beams and the retention arms are positioned on the opposite side of the torsional beams.

2. The socket of claim 1 wherein said contacts receive plating at said wiping areas and an entire surface area of said contacts being at least eighty times the surface area of said wiping area.

3. The socket of claim 1 wherein said pair of torsional beams have a total surface area of at least forty percent of an entire surface area of said contact.

4. The socket of claim 1 wherein an insertion path of said pins is parallel to said retention arms.

5. The socket of claim 1 wherein said retention arms are at a 90° angle to the torsional beams.

* * * * *

UNITED STATES PATENT AND TRADEMARK OFFICE
CERTIFICATE OF CORRECTION

PATENT NO.  :  5,762,511

DATED       :  June 9, 1998

INVENTOR(S) :  John T. Scheitz, et al

It is certified that error appears in the above-identified patent and that said Letters Patent is hereby corrected as shown below:

Column 6, line 38, after "same" and before "with." Please add –plane --.

Signed and Sealed this

Twenty-fifth Day of August, 1998

Attest:

BRUCE LEHMAN

*Attesting Officer*    *Commissioner of Patents and Trademarks*